(12) United States Patent
Deng et al.

(10) Patent No.: US 12,278,293 B2
(45) Date of Patent: Apr. 15, 2025

(54) SEMICONDUCTOR DEVICE COMPRISING A DOPED EPITAXIAL LAYER AND METHOD OF MANUFACTURING THE SAME

(71) Applicant: GPOWER SEMICONDUCTOR, INC., Jiangsu (CN)

(72) Inventors: Guangmin Deng, Jiangsu (CN); Yi Pei, Jiangsu (CN)

(73) Assignee: GPOWER SEMICONDUCTOR, INC., Jiangsu (CN)

( * ) Notice: Subject to any disclaimer, the term of this patent is extended or adjusted under 35 U.S.C. 154(b) by 381 days.

(21) Appl. No.: 17/632,697

(22) PCT Filed: Aug. 5, 2020

(86) PCT No.: PCT/CN2020/107145
§ 371 (c)(1),
(2) Date: Feb. 3, 2022

(87) PCT Pub. No.: WO2021/023228
PCT Pub. Date: Feb. 11, 2021

(65) Prior Publication Data
US 2022/0285565 A1    Sep. 8, 2022

(30) Foreign Application Priority Data

Aug. 5, 2019   (CN) .......................... 201910717046.8

(51) Int. Cl.
*H01L 29/872* (2006.01)
*H01L 29/06* (2006.01)
(Continued)

(52) U.S. Cl.
CPC ........ *H01L 29/872* (2013.01); *H01L 29/0684* (2013.01); *H01L 29/402* (2013.01);
(Continued)

(58) Field of Classification Search
CPC . H01L 29/0684; H01L 29/402; H01L 29/417; H01L 29/66212; H01L 29/66219;
(Continued)

(56) References Cited

U.S. PATENT DOCUMENTS 10,062,766 B1    8/2018  Tsai et al.
2006/0108659 A1   5/2006  Yanagihara et al.
(Continued)

FOREIGN PATENT DOCUMENTS

CN       101694842 A     4/2010
CN       108767018 A    11/2018
(Continued)

*Primary Examiner* — Shahed Ahmed
(74) *Attorney, Agent, or Firm* — Armstrong Teasdale LLP

(57) ABSTRACT

The present disclosure discloses a semiconductor device and a method for preparing the same. The semiconductor device includes a substrate, a doped epitaxial layer located on one side of the substrate, a channel layer located on one side of the doped epitaxial layer away from the substrate, a potential barrier layer located on one side of the channel layer away from the doped epitaxial layer, and a first electrode and a second electrode located on one side of the potential barrier layer away from the channel layer, wherein the first electrode penetrates the potential barrier layer, the channel layer and part of the doped epitaxial layer, the first electrode forms a Schottky contact with the channel layer, and a resistance of the part of the doped epitaxial layer in contact with the first electrode is greater than a resistance of the channel layer.

10 Claims, 6 Drawing Sheets

(51) Int. Cl.
  *H01L 29/40* (2006.01)
  *H01L 29/417* (2006.01)
  *H01L 29/66* (2006.01)
  *H01L 29/20* (2006.01)
  *H01L 29/205* (2006.01)

(52) U.S. Cl.
  CPC ...... *H01L 29/417* (2013.01); *H01L 29/66212* (2013.01); *H01L 29/66219* (2013.01); *H01L 29/2003* (2013.01); *H01L 29/205* (2013.01)

(58) Field of Classification Search
  CPC ....... H01L 29/205; H01L 29/872–8725; H01L 29/66143; H01L 29/2003–207; H01L 21/18–326; H01L 21/02389; H10K 51/0579
  See application file for complete search history.

(56) References Cited

U.S. PATENT DOCUMENTS

| | | | |
|---|---|---|---|
| 2008/0315257 A1* | 12/2008 | Shiraishi | H01L 27/0605 257/195 |
| 2011/0260174 A1 | 10/2011 | Hebert | |
| 2011/0260216 A1 | 10/2011 | Hebert | |
| 2011/0291103 A1* | 12/2011 | Mazzillo | H01L 31/108 438/94 |
| 2013/0134443 A1 | 5/2013 | Terano et al. | |
| 2014/0021481 A1 | 1/2014 | Lee et al. | |
| 2014/0138697 A1* | 5/2014 | Lin | H01L 29/872 438/572 |
| 2014/0264454 A1* | 9/2014 | Banerjee | H01L 29/66462 257/194 |
| 2016/0118490 A1* | 4/2016 | Padmanabhan | H01L 27/0629 257/195 |
| 2016/0181240 A1 | 6/2016 | Mauder et al. | |
| 2018/0358456 A1 | 12/2018 | Iucolano et al. | |
| 2019/0198653 A1 | 6/2019 | Chu et al. | |

FOREIGN PATENT DOCUMENTS

| | | | | |
|---|---|---|---|---|
| CN | 109309130 A | | 2/2019 | |
| CN | 109346521 A | | 2/2019 | |
| CN | 208861994 U | * | 5/2019 | ......... H01L 29/0847 |
| CN | 110073497 A | | 7/2019 | |
| CN | 110518074 A | | 11/2019 | |
| JP | 2010135824 A | | 6/2010 | |
| JP | 2013115362 A | | 6/2013 | |
| JP | 2016526802 A | | 9/2016 | |
| JP | 2018101668 A | | 6/2018 | |

\* cited by examiner

SEMICONDUCTOR DEVICE COMPRISING A DOPED EPITAXIAL LAYER AND METHOD OF MANUFACTURING THE SAME

CROSS REFERENCE TO RELATED APPLICATIONS

This patent application is a National Stage Entry of PCT/CN2020/107145 filed on Aug. 5, 2020, which claims the benefit and priority of Chinese Patent Application No. 201910717046.8 filed on Aug. 5, 2019, the disclosures of which are incorporated by reference herein in their entirety as part of the present application.

BACKGROUND

Embodiments of the present disclosure relate to the field of microelectronic technology, and particularly to a semiconductor device and a method of manufacturing the same.

Semiconductor material gallium nitride has become a current research focus because of its large forbidden band width, high electron saturation drift rate, high breakdown field strength, and good thermal conductivity. In terms of electronic devices, gallium nitride materials are more suitable for manufacturing devices of high temperature, high frequency, high voltage, and high power than Silicon and Gallium Arsenide, so gallium nitride-based electronic devices have good application prospects.

The traditional Schottky diode is a semiconductor diode formed by allowing the metal to contact with the semiconductor layer to form a Schottky potential barrier, and the Schottky potential barrier between the metal and the semiconductor acts as a rectification junction. Compared to PN junction diodes, which are formed entirely in the semiconductor, Schottky diodes have improved switching performance, lower turn-on voltage, and faster switching speed. In practical applications, such as switching power supplies, where switching losses account for the majority of energy consumption, the use of Schottky diodes is an ideal choice.

For existing gallium nitride diodes, if the metal forms a Schottky contact with the potential barrier layer, the turn-on voltage is high due to the high potential barrier. In order to reduce the turn-on voltage of the device, the potential barrier layer is etched and removed so that the metal forms a Schottky contact with the channel layer. Since the reduction of the potential barrier leads to a high leakage of the diode, the prior art cannot take into account the low turn-on voltage and low leakage of the diode, which affects the performance of the diode.

BRIEF DESCRIPTION

In view of the above, embodiments of the present disclosure provide a semiconductor device and a method of manufacturing the same to solve the technical problem that the prior art cannot take into account the low turn-on voltage and low leakage of the diode and the poor performance of the diode.

In a first aspect, an embodiment of the present disclosure provides a semiconductor device, including a substrate, a doped epitaxial layer located on one side of the substrate, a channel layer located on one side of the doped epitaxial layer away from the substrate, a potential barrier layer located on one side of the channel layer away from the doped epitaxial layer, and a first electrode and a second electrode located on one side of the potential barrier layer away from the channel layer, wherein the first electrode penetrates the potential barrier layer, the channel layer and part of the doped epitaxial layer, the first electrode forms a Schottky contact with the channel layer, and a resistance of the part of the doped epitaxial layer in contact with the first electrode is greater than a resistance of the channel layer.

The first electrode may include a first electrode bottom surface located within the doped epitaxial layer, and a distance L2 between the first electrode bottom surface and a surface on one side of the channel layer close to the substrate satisfies L2≤200 nm.

Along a direction perpendicular to the substrate, a thickness h1 of the doped epitaxial layer may satisfy 10 nm≤h1≤50 μm.

The doped epitaxial layer may include a P-type or N-type doped region, and the P-type or N-type doped region is in contact with at least a part of the first electrode located within the doped epitaxial layer.

The first electrode may be an anode, and the anode may include a first corner and a second corner located within the doped epitaxial layer, and an anode bottom surface connecting the first corner and the second corner, and the P-type or N-type doped region envelopes at least a part of the first corner and/or the second corner.

The P-type or N-type doped region may envelope the first corner, the second corner, and the anode bottom surface.

A two-dimensional electron gas may be formed by the potential barrier layer and the channel layer, and along a direction perpendicular to the substrate, a distance L1 between the P-type or N-type doped region and the two-dimensional electron gas satisfies L1≥50 nm.

The second electrode may be a cathode and the anode extends in a first direction, wherein the first direction is parallel to the substrate and perpendicular to the direction of the cathode pointing towards the anode, and the P-type or N-type doped region extends along the first direction, or along the first direction, the P-type or N-type doped region includes a plurality of spaced apart P-type or N-type sub-doped regions.

The semiconductor device may further include an anode metal field plate, the anode includes a first anode portion and a second anode portion, the first anode portion penetrates the potential barrier layer, the channel layer and part of the doped epitaxial layer, and the first anode portion forms a Schottky contact with the channel layer, and the second anode portion is located on a surface of the potential barrier layer on the side away from the channel layer, and the second anode portion is used as the anode metal field plate.

The semiconductor device may further include a buffer layer located between the substrate and the channel layer.

Part of the side of the buffer layer close to the channel layer may be a high resistance layer, and the doped epitaxial layer is the high resistance layer.

In a second aspect, an embodiment of the present disclosure further provides a method of manufacturing a semiconductor device, including providing a substrate, forming a doped epitaxial layer on one side of the substrate, forming a channel layer on one side of the doped epitaxial layer away from the substrate, forming a potential barrier layer on one side of the channel layer away from the doped epitaxial layer, and forming a first electrode and a second electrode on one side of the potential barrier layer away from the channel layer, wherein the first electrode penetrates the potential barrier layer, the channel layer, and part of the doped epitaxial layer, the first electrode forms a Schottky contact with the channel layer, and a resistance of the part of the doped epitaxial layer in contact with the first electrode is greater than a resistance of the channel layer.

After the step of forming a doped epitaxial layer on one side of the substrate, the method may further include forming a P-type or N-type doped region in the doped epitaxial layer, wherein the P-type or N-type doped region is in contact with at least a part of the first electrode in the doped epitaxial layer.

The first electrode may be an anode, and the anode includes a first corner, a second corner located within the doped epitaxial layer, and an anode bottom surface connecting the first corner and the second corner, and the P-type or N-type doped region envelopes at least a part of the first corner and/or the second corner.

According to the semiconductor device and the method of manufacturing the same provided by the embodiments of the present disclosure, a doped epitaxial layer is added in the semiconductor device, at the same time, the resistance of the part of the doped epitaxial layer in contact with the first electrode is arranged to be greater than the resistance of the channel layer, and at the same time, the first electrode is arranged to penetrate the potential barrier layer, the channel layer and part of the doped epitaxial layer, and a Schottky contact is formed by the first electrode with the channel layer. On the one hand, since the Schottky electrode is in direct contact with the doped epitaxial layer under the channel layer, the turn-on voltage of the semiconductor device may be reduced, and on the other hand, since the resistance of the part of the doped epitaxial layer in contact with the first electrode is greater than the resistance of the channel layer, the Schottky contact formed by the first electrode and the channel layer may also reduce the reverse bias leakage to ensure that the semiconductor device may take into account the characteristics of low turn-on voltage and low reverse leakage, and improve the electrical performance of the semiconductor device.

BRIEF DESCRIPTION OF THE DRAWINGS

In order to describe the technical solutions of the exemplary embodiments of the present disclosure more clearly, the following briefly introduces the drawings required to describe the embodiments. Obviously, the drawings introduced are only drawings of a part of the embodiments to be described in the present disclosure, rather than all the drawings. Those of ordinary skill in the art can also obtain other drawings based on these drawings without making inventive labor.

DETAILED DESCRIPTION

In order to clarify the technical solution and advantages of the present disclosure, the technical solutions of the present disclosure will be completely described in conjunction with the drawings of the embodiments of the present disclosure below by means of specific embodiments. Obviously, the embodiments to be described refer to a part of the embodiments of the present disclosure, other than all of the embodiments. Based on the embodiments of the present disclosure, all other embodiments obtained by those of ordinary skill in the art without making inventive labor fall within the protection scope of the present disclosure. For instance, FIG. 1 illustrates an embodiment in which the semiconductor device is a diode, at which time the first electrode is an anode and the second electrode is a cathode, but the semiconductor device may also be other devices.

Figure 1:
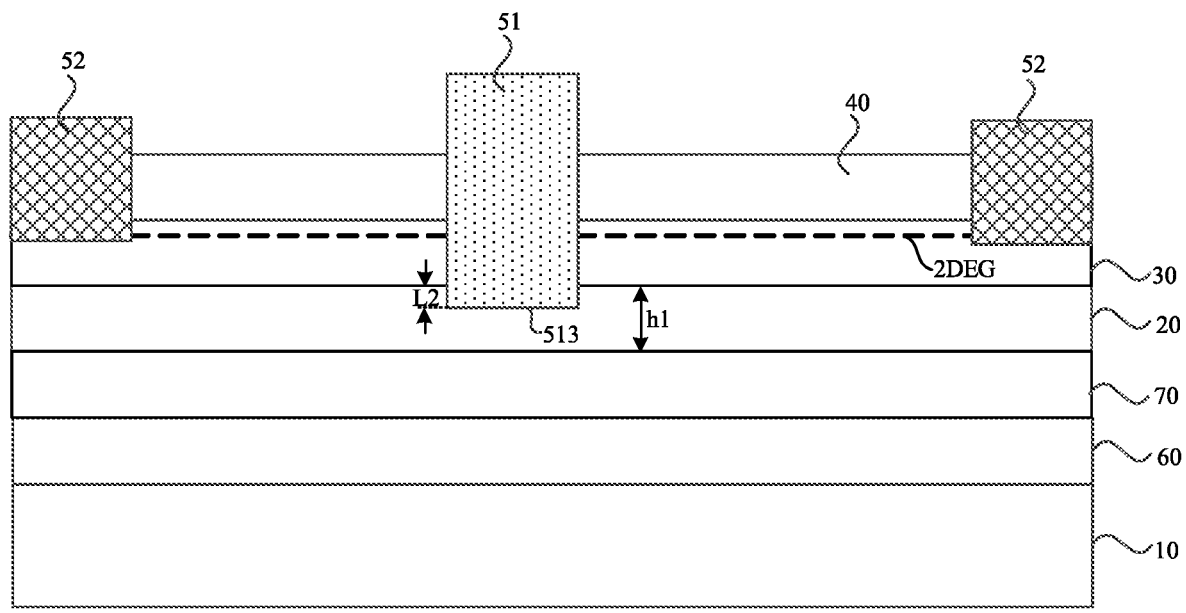
FIG. 1 is a schematic diagram of the structure of a semiconductor device provided by an embodiment of the present disclosure.

FIG. 1 is a schematic diagram of the structure of a semiconductor device provided by an embodiment of the present disclosure. As shown in FIG. 1, the semiconductor device provided by the embodiment of the present disclosure may include a substrate 10, a doped epitaxial layer 20 located on one side of the substrate 10, a channel layer 30 located on one side of the doped epitaxial layer 20 away from the substrate 10, a potential barrier layer 40 located on one side of the channel layer 30 away from the doped epitaxial layer 20, and an anode 51 and a cathode 52 located on one side of the potential barrier layer 40 away from the channel layer 30, wherein the anode 51 penetrates the potential barrier layer 40, the channel layer 30 and part of the doped epitaxial layer 20, the anode 51 forms a Schottky contact with the channel layer 30, and a resistance of the part of the doped epitaxial layer 20 in contact with the anode 51 is greater than a resistance of the channel layer 30.

Here, it may be that the resistance of the part of the doped epitaxial layer 20 only in contact with the anode 51 is greater than the resistance of the channel layer 30, it may also be that the resistance of the layer of the doped epitaxial layer 20 including the part in contact with the anode 51, i.e., the layer of the side close to the channel layer 30, is greater than the resistance of the channel layer 30, and it may also be that the resistance of the entire layer of the doped epitaxial layer 20 is greater than the resistance of the channel layer 30.

Specifically, the anode 51 penetrates the channel layer 30 and forms a Schottky contact with the channel layer 30. Since the anode 51 penetrates the channel layer 30 and achieves the maximum contact area with the channel layer 30, this results in a low Schottky barrier between the anode 51 and the channel layer 30, which may reduce the turn-on voltage of the semiconductor device and improve the switching performance of the semiconductor device. Further, since the anode bottom is located in the doped epitaxial layer 20, if the doped epitaxial layer 20 is n-type doped, the depletion layer of the epitaxial layer is wider during reverse bias, reducing the peak electric field at the anode edge. If the doped epitaxial layer 20 is P-type doped, it may assist in depleting the two-dimensional electron gas during reverse bias, reducing the peak electric field and lowering the reverse bias leakage.

The substrate 10 may be a combination of one or more of gallium nitride, aluminum gallium nitride, indium gallium nitride, aluminum indium gallium nitride, indium phosphide, gallium arsenide, silicon carbide, diamond, sapphire, germanium, silicon, or any other material capable of growing group III nitrides.

The doped epitaxial layer 20 may include a semiconductor material based on a group III-V compound, for example, it may be AlGaN, GaN, AlN, or AlGaInN. By doping or ion implantation in the doped epitaxial layer 20, it may be doped with a P-type material or an N-type material, which is not limited by the embodiment of the present disclosure, as long as the resistance of the doped epitaxial layer 20 is ensured to be high. For instance, the GaN may be doped with C elements to form a high resistance C—GaN.

The material of the channel layer 30 may be GaN or InAlN, or silicon or other semiconductor materials, which is not limited by the embodiment of the present disclosure. The channel layer 30 may be an unintentionally doped gallium nitride layer (UID-GaN).

The material of the potential barrier layer 40 may be a semiconductor material including gallium like compound or nitrogen like compound, or it may be silicon or other semiconductor materials, which is not limited by the embodiment of the present disclosure. Exemplarily, the potential barrier layer 40 may be $In_xAl_yGaZN_{1-x-y-z}$, where $0 \le x \le 1$, $0 \le y \le 1$, and $0 \le z \le 1$. The channel layer 30 and the potential barrier layer 40 may form a semiconductor heterojunction structure, a high concentration two-dimensional electron gas (2 DEG) is formed in the channel layer 30 close to the interface between the channel layer 30 and the potential barrier layer 40, and the channel layer 30 provides a channel for two-dimensional electron gas motion.

To sum up, by adding a doped epitaxial layer 20 in the semiconductor device, the anode 51 is set to penetrate the potential barrier layer 40, the channel layer 30, and part of the doped epitaxial layer 20, and a Schottky contact is formed between the anode 51 and the entire thickness of the channel layer 30; on the one hand, the low turn-on voltage is achieved by increasing the Schottky barrier contact area between the anode 51 and the channel layer 30; on the other hand, the peak electric field at the anode edge is reduced by locating the bottom of anode 51 in doped epitaxial layer 20, which reduces reverse bias leakage. In this way, the semiconductor device may take into account the characteristics of low turn-on voltage and low reverse leakage, and improve the electrical performance of the semiconductor device.

Continuing to refer to FIG. 1, the anode 51 includes an anode bottom surface 513 located within the doped epitaxial layer 20, the distance L2 between the anode bottom surface 513 and the surface of the channel layer 30 close the substrate 10 side satisfies L2≤200 nm.

Exemplarily, the distance L2 between the anode bottom surface 513 and a surface on one side of the channel layer 30 close to the substrate 10 satisfies L2≤200 nm, where L2 may be any value less than 200 nm or any value range, such as 20 nm, 40 nm, 60 nm, 90 nm, 120 nm, 30~70 nm, or 100~160 nm, which is not limited by the embodiment of the present disclosure and will not list them one by one. The distance between the anode bottom surface 513 and the surface of the channel layer 30 close to the substrate 10 is set reasonably to ensure that the breakdown voltage between the anode 51 and the substrate 10 is maintained at a relatively high level, ensuring that the breakdown resistance of the semiconductor device is good, and avoiding that the breakdown voltage between the anode 51 and the substrate 10 is reduced and the breakdown risk of the semiconductor device is increased due to the excessive distance between the anode bottom surface 513 and the surface of the channel layer 30 close to the substrate 10.

The distance L2 between the anode bottom surface 513 and a surface on one side of the channel layer 30 close to the substrate 10 may satisfy 1 nm≤L2≤100 nm, where L2 may be any value or any value range in 1~100 nm, such as 5 nm, 15 nm, 30 nm, 50 nm, 80 nm, 10~20 nm, or 40~60 nm, which is not limited by the embodiment of the present disclosure and will not list them one by one. Reasonable setting of the distance between the anode base 513 and the surface of the channel layer 30 near the substrate 10 may on the one hand ensure that the breakdown voltage between the anode 51 and the substrate 10 is maintained at a high level and ensure good breakdown resistance of the semiconductor device, and on the other hand, may also reduce the reverse leakage of the semiconductor device. In addition, this may also ensure that the overall thickness of the semiconductor device is small, which is conducive to achieving a thin and miniaturized design of the semiconductor device.

Continuing to refer to FIG. 1, along the direction perpendicular to the substrate 10, the thickness h1 of the doped epitaxial layer 20 satisfies 10 nm≤h1≤50 μm.

Exemplarily, h1 may be any value or in any value range of 10 nm~50 μm, such as 20 nm, 80 nm, 200 nm, 1 μm, 30 μm, 30 nm~20 μm or 100 nm~40 μm, which is not limited by the embodiment of the present disclosure and will not list them one by one. Reasonable setting of the thickness of the doped epitaxial layer 20 on the one hand may ensure the performance the semiconductor device with low turn-on voltage and low reverse leakage, and may on the other hand also ensure the overall thickness of the semiconductor device is small, which is conducive to the realization of thin and miniaturized design of the semiconductor device; in addition, this may also ensure that the thickness of the doped epitaxial layer 20 matches the existing semiconductor device manufacturing process, ensuring that the manufacturing process of the doped epitaxial layer 20 is simple.

The doped epitaxial layer may include a P-type or N-type doped region, the P-type or N-type doped region being in contact with at least part of the anode located in the doped epitaxial layer.

Figure 2:
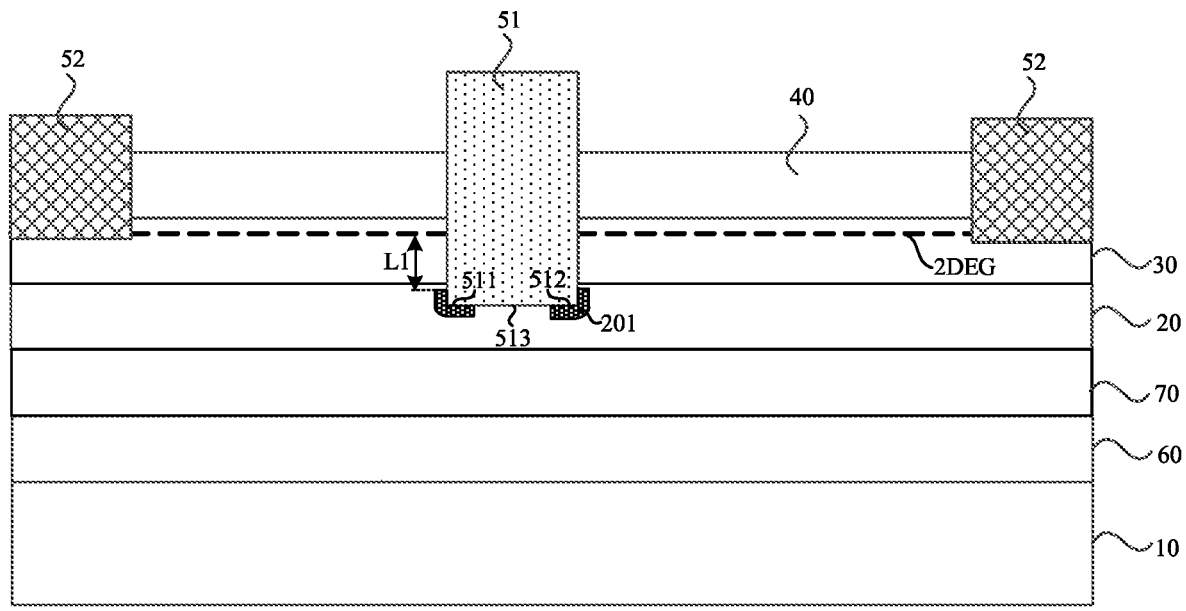
FIG. 2 is a schematic diagram of the structure of another semiconductor device provided by an embodiment of the present disclosure.

FIG. 2 is a schematic diagram of the structure of another semiconductor device provided by an embodiment of the present disclosure. As shown in FIG. 2, in the semiconductor device provided by the embodiment of the present disclosure, the anode 51 includes a first corner 511 and a second corner 512 located within the doped epitaxial layer 20, and an anode bottom surface 513 connecting the first corner 511 and the second corner 512. The doped epitaxial layer 20 includes a P-type or N-type doped region 201 that envelops at least part of the first corner 511 and/or the second corner 512.

Exemplarily, the P-type or N-type doped region 201 may be obtained by ion implantation followed by annealing activation in the doped epitaxial layer 20. Since the peak electric field at the first corner 511 and second corner 512 locations is large, providing the P-type or N-type doped region 201 to cover at least part of the first corner 511 and/or second corner 512 may reduce the peak electric field at the first corner 511 and second corner 512 locations and reduce the reverse bias leakage of the semiconductor device. Additionally, the P-type or N-type doped region 201 covers at least part of the anode bottom surface 513.

Figure 3:
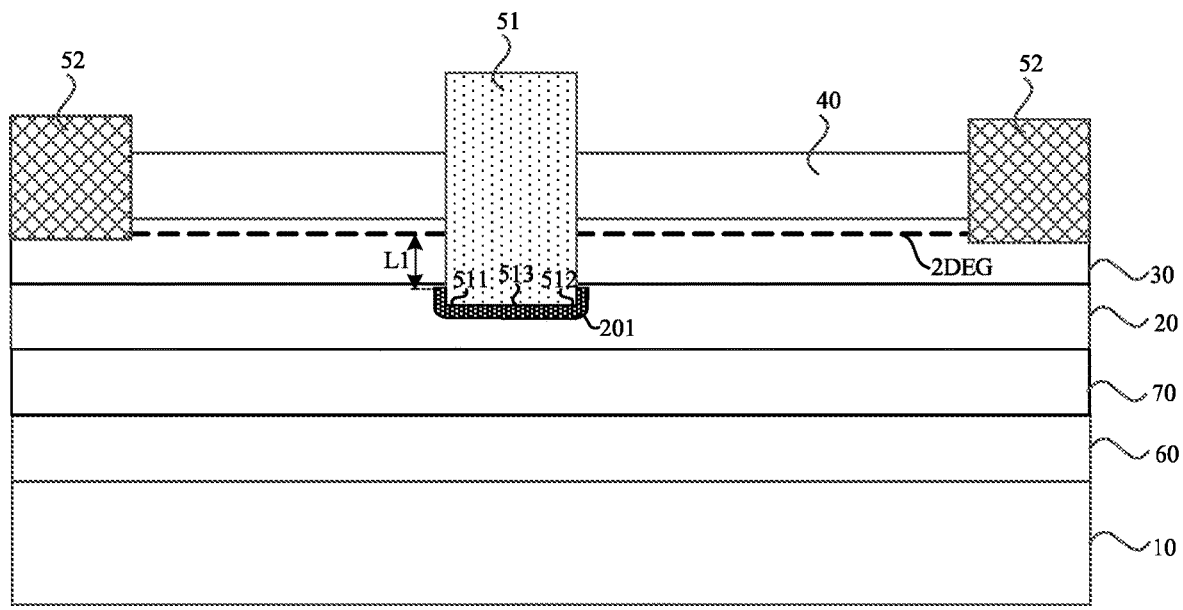
FIG. 3 is a schematic diagram of the structure of another semiconductor device provided by an embodiment of the present disclosure.

FIG. 3 is a schematic diagram of the structure of another semiconductor device provided by an embodiment of the present disclosure. As shown in FIG. 3, the P-type or N-type doped region 201 envelops the first corner 511, the second corner 512, and the anode bottom surface 513.

Exemplarily, the doped epitaxial layer 20 is provided to include a P-type or N-type doped region 201, and the P-type or N-type doped region 201 envelops the first corner 511, the second corner 512 and the anode bottom surface 513, so that the P-type or N-type doped region 201 all surrounds the bottom of the anode 51, which may increase the contact area between the anode 51 and the P-type or N-type doped region 201, and may increase the surge current resistance of the semiconductor device and improve the stability of the semiconductor device.

Continuing to refer to FIG. 2 or FIG. 3, along a direction perpendicular to the substrate 10, the distance L1 between the P-type or N-type doped region 201 and the two-dimensional electron gas satisfies L1≥50 nm.

Exemplarily, L1 may be any value or any range of values greater than 50 nm, such as 70 nm, 100 nm, 150 nm, 60~80 nm or 100~180 nm, which is not limited by the embodiment of the present disclosure and will not list them one by one. Reasonable setting of the distance between the P-type or N-type doped region 201 and the two-dimensional electron gas may reduce the loss of the two-dimensional electron gas caused by the P-type or N-type doped region 201, reduce the impact of the P-type or N-type doped region 201 on the performance of the semiconductor device, and ensure that the electrical performance of the semiconductor device is stable.

Figure 4:
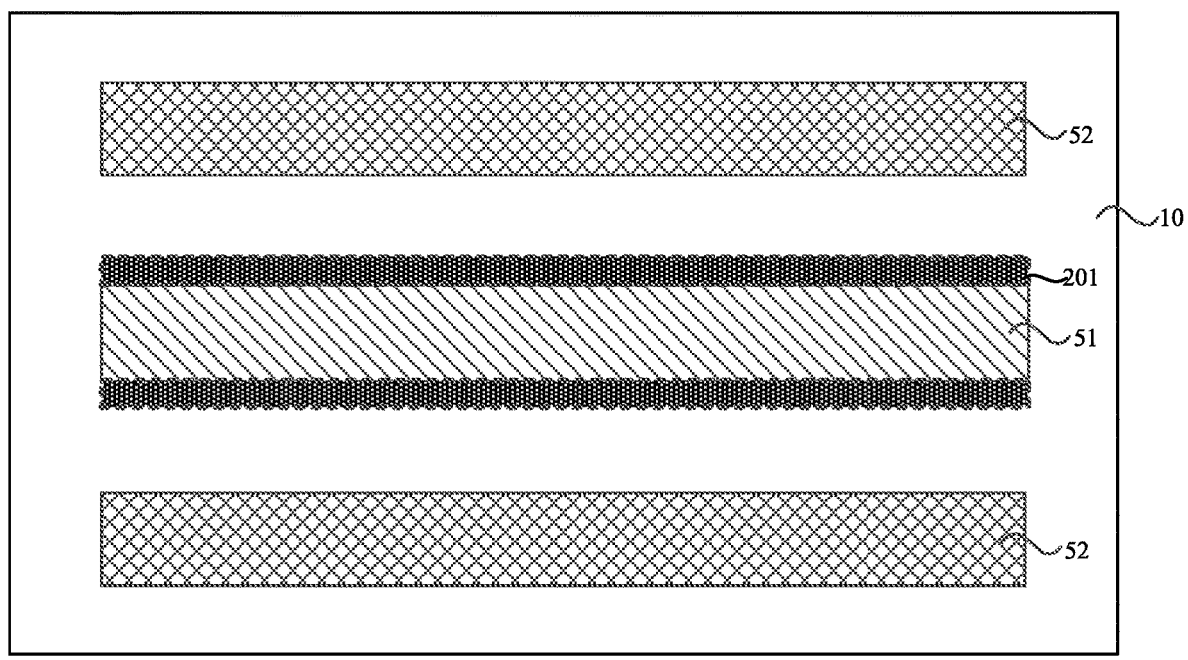
FIG. 4 is a schematic diagram of a top view of the structure of a semiconductor device provided by an embodiment of the present disclosure.
Figure 5:
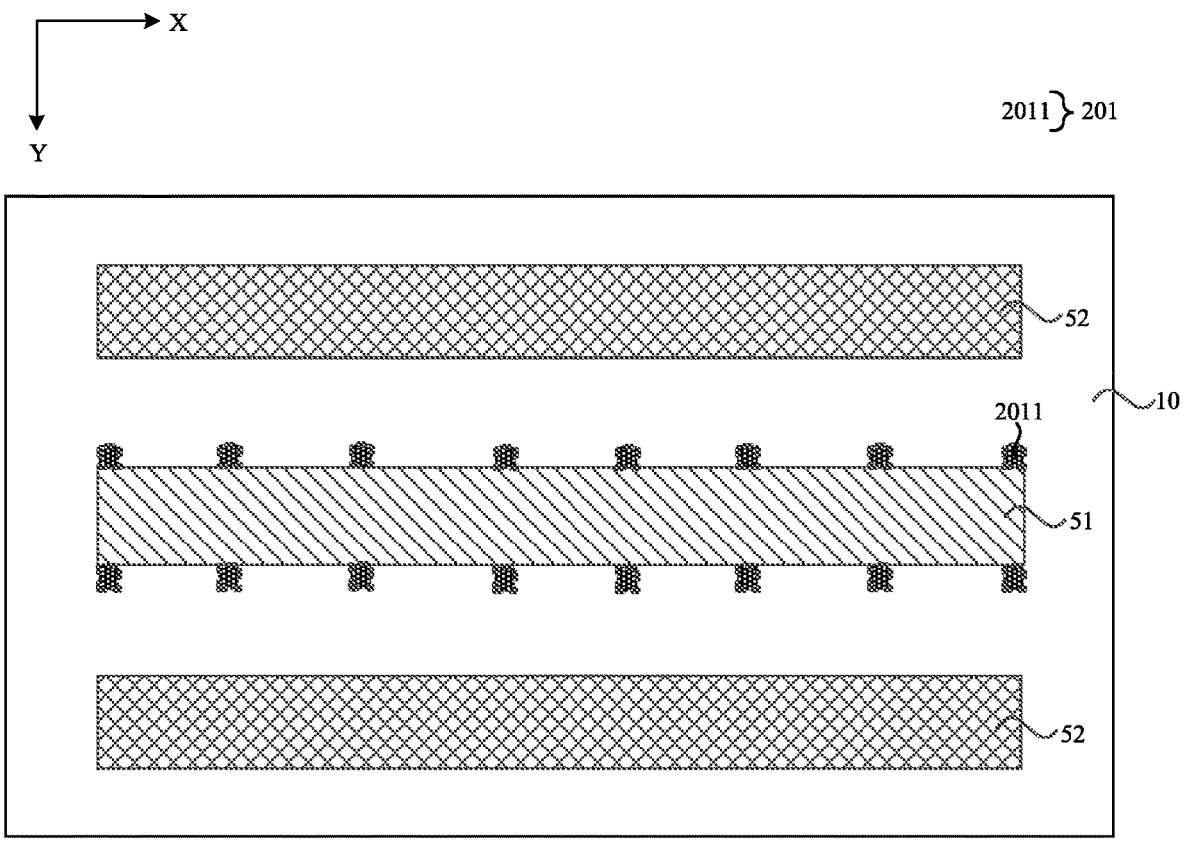
FIG. 5 is a schematic diagram of the top view of the structure of another semiconductor device provided by an embodiment of the present disclosure.

FIG. 4 is a schematic diagram of a top view of the structure of a semiconductor device provided by an embodiment of the present disclosure, and FIG. 5 is a schematic diagram of the top view of the structure of another semiconductor device provided by an embodiment of the present disclosure. As shown in FIG. 4 and FIG. 5, the anode 51 extends along a first direction (the X direction as shown in the drawings), wherein the first direction is parallel to the substrate 10 and perpendicular to a second direction (the Y direction as shown in the drawings) in which the cathode 52 points towards the anode 51, the P-type or N-type doped region 201 extends along the first direction (as shown in FIG. 4), or along the first direction, the P-type or N-type doped region 201 includes a plurality of spaced apart P-type or N-type sub-doped regions 2011 (as shown in FIG. 5).

Exemplarily, the anode 51 extends along the first direction (the X direction as shown in the drawings) (as shown in FIGS. 4-5), and extends along a third direction perpendicular to the substrate 10, penetrates the channel layer 30 in the third direction and forms a Schottky contact therewith, and extends to the doped epitaxial layer 20 (as shown in FIGS. 1-3). Therein, the P-type or N-type doped region 201 in the doped epitaxial layer 20 may be provided continuously extending along the first direction, as shown in FIG. 4; it may also be that along the first direction, the P-type or N-type doped region 201 includes a plurality of spaced apart P-type or N-type sub-doped regions 2011, which are spaced apart in the first direction, as shown in FIG. 5. The way in which the P-type or N-type doped regions 201 are provided is not limited by the embodiment of the present disclosure, as long as it is sufficient to ensure that the P-type or N-type doped region 201 envelops at least part of the first corner 511 and/or the second corner 512 and may reduce the reverse bias leakage of the semiconductor device. Optionally, when the plurality of P-type or N-type sub-doped regions 2011 are spaced apart in the first direction, the distance between any two adjacent P-type or N-type sub-doped regions 2011 may be the same or different, and this is not limited by the embodiment of the present disclosure.

Figure 6:
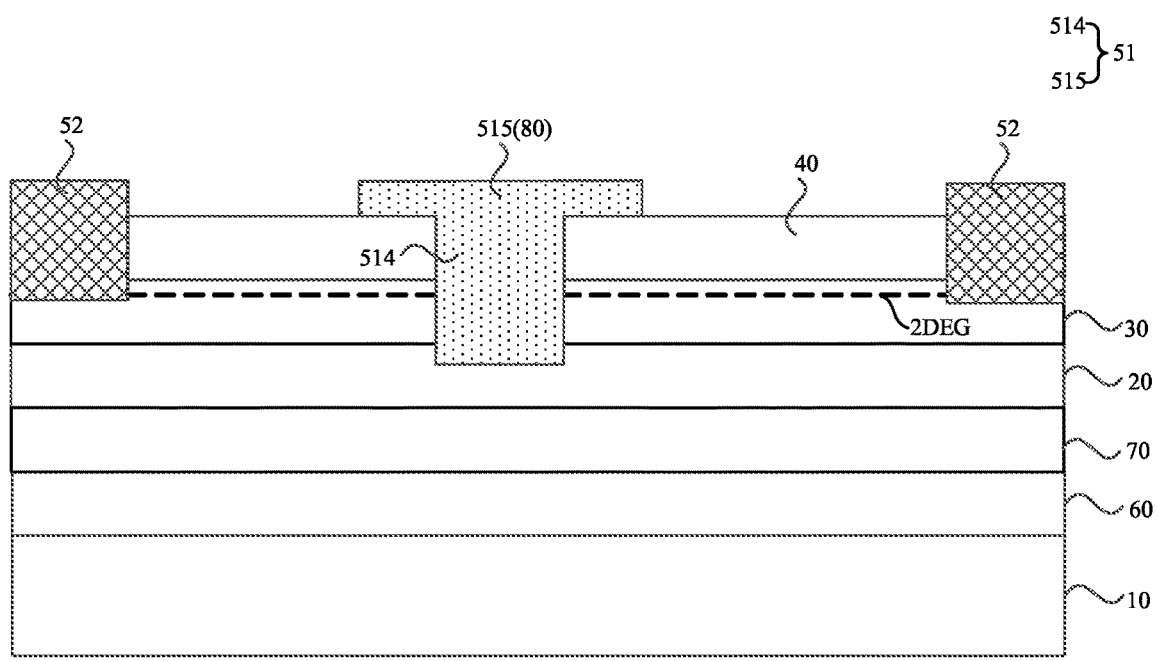
FIG. 6 is a schematic diagram of the structure of another semiconductor device provided by an embodiment of the present disclosure.

FIG. 6 is a schematic diagram of the structure of another semiconductor device provided by an embodiment of the present disclosure. As shown in FIG. 6, the semiconductor device provided by the embodiment of the present disclosure further includes an anode metal field plate 80, the anode 51 includes a first anode portion 514 and a second anode portion 515, the first anode portion 514 penetrates the potential barrier layer 40, the channel layer 30 and part of the doped epitaxial layer 20, and the first anode portion 514 forms a Schottky contact with the channel layer 30, and the second anode portion 515 is located on a surface of the potential barrier layer 40 on the side away from the channel layer 30, and the second anode portion 515 is used as the anode metal field plate 80.

Specifically, the anode 51 includes a first anode portion 514 that penetrates the potential barrier layer 40, the channel layer 30 and part of the doped epitaxial layer 20, and a second anode portion 515 located on a surface of the potential barrier layer 40 on the side away from the channel layer 30, and the second anode portion 515 is used as the anode metal field plate 80. The first anode portion 514 penetrates the channel layer 30 and forms a Schottky contact with the channel layer 30 to reduce the turn-on voltage and reverse bias leakage of the semiconductor device and ensure that the semiconductor device may take into account the characteristics of low turn-on voltage and low reverse leakage; the second anode portion 515 is used as the anode metal field plate 80 to adjust the electric field of the semiconductor device and increase the electric field adjustment ability of the anode 51 to the semiconductor device. The cross-sectional shape of the first anode portion 514 may be rectangular or inverted trapezoidal, which is not limited by the embodiment of the present disclosure.

Continuing to refer to FIG. 1, the semiconductor device provided by the embodiment of the present disclosure may further include a nucleation layer 60 located on the substrate 10 and a buffer layer 70 located on the side of the nucleation layer 60 away from the substrate 10. The structure design may ensure the crystal quality of the doped epitaxial layer 20, reduce surface morphology defects, and effectively improve the electrical performance stability of the semiconductor device. The nucleation layer 60 varies with different substrate materials and mainly serves to match the substrate material and the semiconductor material layers in the heterojunction structure. The nucleation layer 60 may be nitride, specifically GaN or AlN or other nitrides, or silicon or other semiconductor materials, which is not limited by the embodiment of the present disclosure. The material of the buffer layer 70 may be one or more layers of group III nitride materials such as AlGaN, GaN, AlN, or AlGaInN.

Figure 7:
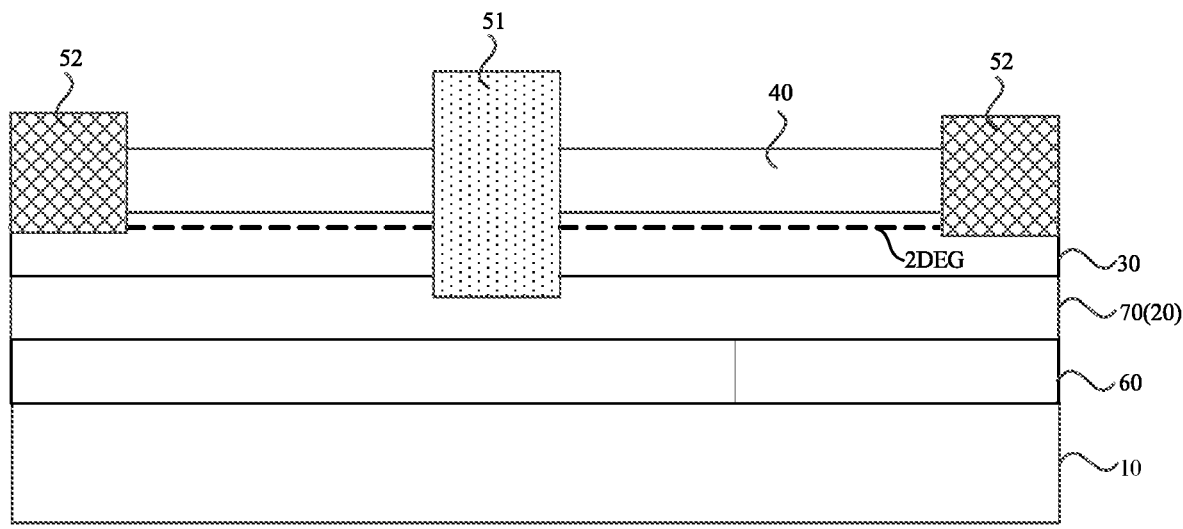
FIG. 7 is a schematic diagram of the structure of another semiconductor device provided by an embodiment of the present disclosure.

FIG. 7 is a schematic diagram of the structure of another semiconductor device provided by an embodiment of the present disclosure. As shown in FIG. 7, the buffer layer 70 is used as the doped epitaxial layer 20.

Exemplarily, when the resistance of the buffer layer 70 is greater than the resistance of the channel layer 30, the buffer layer 70 may be multiplexed as the doped epitaxial layer 20; thus, the anode 51 penetrates the potential barrier layer 40 and the channel layer 30, and partially penetrates the buffer layer 70, which can achieve a low turn-on voltage while reducing the reverse bias leakage. Part of the side of the buffer layer 70 close to the channel layer 30 may be a high resistance layer, and this part of the high resistance layer forms a direct contact with the anode 51.

Figure 8:
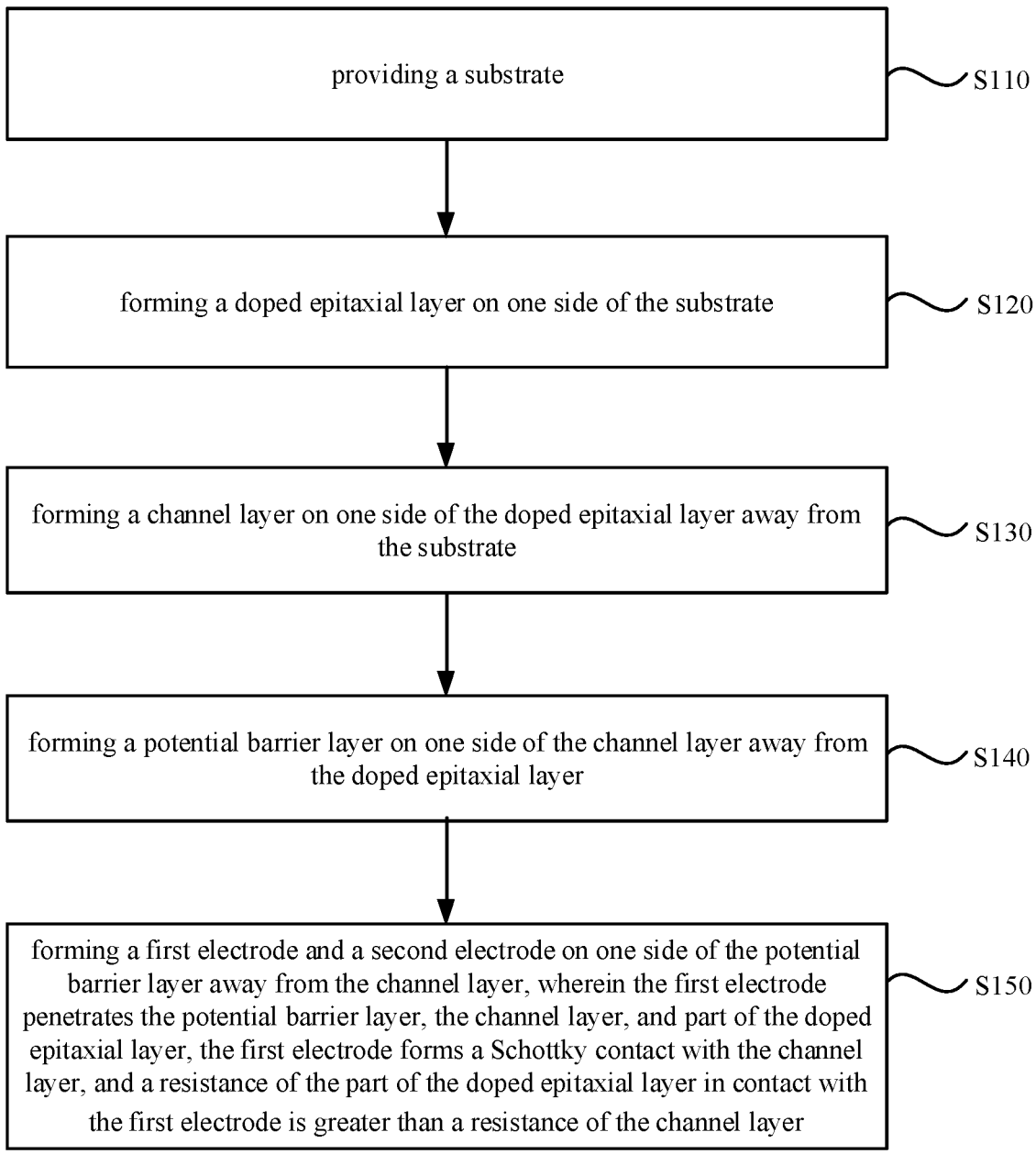
FIG. 8 is a schematic diagram of the flow of a method of manufacturing a semiconductor device provided by an embodiment of the present disclosure.

Based on the same inventive concept, an embodiment of the present disclosure further provides a method of manufacturing a semiconductor device. As shown in FIG. 8, the method of manufacturing a semiconductor device provided by the embodiment of the present disclosure may include:

S110: providing a substrate.

Exemplarily, the substrate may be a combination of one or more of gallium nitride, aluminum gallium nitride, indium gallium nitride, aluminum indium gallium nitride, indium phosphide, gallium arsenide, silicon carbide, diamond, sapphire, germanium, silicon, or any other material capable of growing group III nitrides. The substrate may be manufactured by atmospheric pressure chemical vapor deposition, sub atmospheric pressure chemical vapor deposition, metal organic compound vapor deposition, low pressure chemical vapor deposition, high density plasma chemical vapor deposition, ultra-high vacuum chemical vapor deposition, plasma-enhanced chemical vapor deposition, catalytic chemical vapor deposition, hybrid physical chemical vapor deposition, rapid thermal chemical vapor deposition, gas phase epitaxy, pulsed laser deposition, atomic layer epitaxy, molecular beam epitaxy, sputtering, or evaporation.

S120: forming a doped epitaxial layer on one side of the substrate.

S130: forming a channel layer on one side of the doped epitaxial layer away from the substrate.

S140: forming a potential barrier layer on one side of the channel layer away from the doped epitaxial layer.

Exemplarily, the doped epitaxial layer may include semiconductor materials based on III-V compounds, the material of the channel layer may be GaN or InAlN, or silicon or other semiconductor materials, the material of the potential barrier layer may include gallium-like compound semiconductor materials or nitrogen-like compound semiconductor materials, or silicon or other semiconductor materials, materials and manufacturing processes of the doped epitaxial layer, the channel layer and the potential barrier layer are not limited by the embodiment of the present disclosure.

The doped epitaxial layer with higher resistance may be obtained by doping or ion injection in the doped epitaxial layer, specifically by doping P-type materials or N-type materials, for example, C elements may be doped in GaN to form a high resistance C—GaN. The method of doping or ion injection to obtain the doped epitaxial layer with higher resistance is not limited in the embodiment of the present disclosure and it is only necessary to ensure that the resistance of the part of the doped epitaxial layer in contact with the anode is greater than the resistance of the channel layer. Here, it is possible that the resistance of only the part of the doped epitaxial layer in contact with the anode is greater than the resistance of the channel layer, or that the resistance of the doped epitaxial layer including the part in contact with the anode, i.e., the layer on the side close to the channel layer, is greater than the resistance of the channel layer, or that the resistance of the entire lay of the doped epitaxial layer is greater than the resistance of the channel layer.

S150: forming an anode and a cathode on one side of the potential barrier layer away from the channel layer, wherein the anode penetrates the potential barrier layer, the channel layer, and part of the doped epitaxial layer, the anode forms a Schottky contact with the channel layer, and a resistance of the portion of the part of the doped epitaxial layer in contact with the anode is greater than a resistance of the channel layer.

Exemplarily, before the anode is formed, the potential barrier layer, channel layer and part of the doped epitaxial layer corresponding to the anode forming region are etched and removed, to ensure that the formed anode penetrates the potential barrier layer, the channel layer and the part of the doped epitaxial layer, and form a Schottky contact in the channel layer, thus, the Schottky anode functions as a rectifier junction, which may reduce the turn-on voltage of the semiconductor device and improve the switching performance of the semiconductor device. Further, since the doped epitaxial layer is located on the side of the channel layer close to the substrate and located on the lower side of the channel layer, the direct contact between the Schottky anode and the doped epitaxial layer may effectively reduce the potential barrier height, further reduce the turn-on voltage of the semiconductor device and further improve the switching performance of the semiconductor device. Further, since the resistance of the part of the doped epitaxial layer in contact with the anode is greater than the resistance of the channel layer, the bottom of the formed anode is set within the doped epitaxial layer with a higher resistance, and it may help deplete the two-dimensional electron gas when the semiconductor device is reverse biased, reduce the peak voltage, and reduce the reverse bias leakage.

To sum up, according to the method of manufacturing a semiconductor device provided by the embodiment of the present disclosure, a doped epitaxial layer is added in the semiconductor device, the Schottky anode is arranged to penetrate the potential barrier layer, the channel layer and part of the doped epitaxial layer. On the one hand, the turn-on voltage of the semiconductor device is reduced by the Schottky potential barrier between the anode and the doped epitaxial layer, on the other hand, the direct contact between the Schottky anode and the doped epitaxial layer reduces the potential barrier height and further reduces the turn-on voltage of the semiconductor device. In addition, since the resistance of the part of the doped epitaxial layer in contact with the anode is greater than the resistance of the channel layer, the reverse bias leakage may be reduced by placing the bottom of the anode in the doped epitaxial layer with higher resistance. Thus, the semiconductor device may take into account the characteristics of low turn-on voltage and low reverse leakage, and improve the electrical performance of the semiconductor device.

Figure 9:
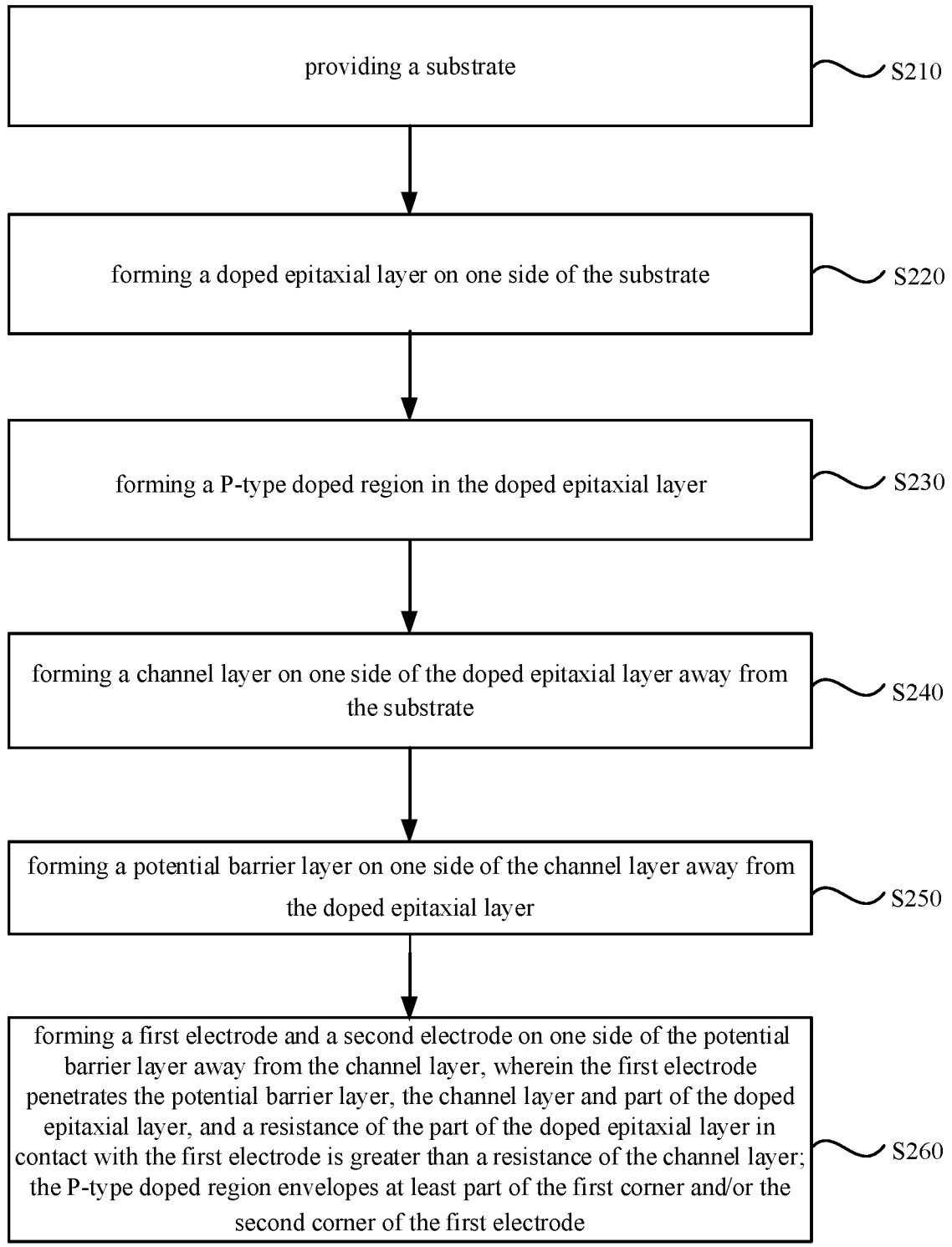
FIG. 9 is a schematic diagram of the flow of a method of manufacturing another semiconductor device provided by an embodiment of the present disclosure.

FIG. 9 is a schematic diagram of the flow of a method of manufacturing another semiconductor device provided by an embodiment of the present disclosure. According to the method of manufacturing a semiconductor device provided in FIG. 9, on the basis of the above-mentioned embodiment, a step of forming a P-type or N-type doped region in the doped epitaxial layer is added. As shown in FIG. 9, the method of manufacturing a semiconductor device provided by the embodiment of the present disclosure may include:

S210: providing a substrate.

S220: forming a doped epitaxial layer on one side of the substrate.

S230: forming a P-type or N-type doped region in the doped epitaxial layer.

S240: forming a channel layer on one side of the doped epitaxial layer away from the substrate.

S250: forming a potential barrier layer on one side of the channel layer away from the doped epitaxial layer.

S260: forming an anode and a cathode on one side of the potential barrier layer away from the channel layer, wherein the anode penetrates the potential barrier layer, the channel layer, and part of the doped epitaxial layer, and a resistance of the part of the doped epitaxial layer in contact with the anode is greater than a resistance of the channel layer, the P-type or N-type doped region envelopes at least part of the first corner and/or the second corner of the anode.

Exemplarily, the anode includes a first corner, a second corner, and an anode bottom surface connecting the first corner and the second corner. P-type or N-type doped region may be formed in the doped epitaxial layer by ion injection-annealing activation, and the P-type or N-type doped region envelopes at least part of the first corner and/or the second corner of the anode. The peak electric field at the first corner and the second corner is further reduced by the P-type or N-type doped region and the reverse leakage of the semiconductor device is further reduced, which can ensure that the manufactured semiconductor device takes into account the characteristics of low turn-on voltage and low reverse leakage. Further, the P-type or N-type doped region may be manufactured to envelope the first corner, the second corner of the anode, and the anode bottom surface connecting the first corner and the second corner to enhance the surge current resistance of the semiconductor device.

It should be noted that, the above is only example embodiments and technical principles of the present disclosure. It would be appreciated by those skilled in the art that the present disclosure is not limited to specific embodiments described herein, and various obvious changes, readjustments, combinations, and alternatives can be made by those skilled in the art without departing from the protection scope of the present disclosure. Therefore, although the present disclosure has been described in detail by way of the above embodiments, the present disclosure is not limited to the above embodiments, and many other equivalent embodiments may be included without departing from the concept of the present disclosure. The scope of the present disclosure is determined by the scope of the appended claims.

What is claimed is:

1. A semiconductor device comprising:
   a substrate;
   a doped epitaxial layer located on one side of the substrate;
   a channel layer located on one side of the doped epitaxial layer away from the substrate;
   a potential barrier layer located on one side of the channel layer away from the doped epitaxial layer;
   a first electrode and a second electrode located on one side of the potential barrier layer away from the channel layer, wherein the first electrode penetrates the potential barrier layer, the channel layer, and part of the doped epitaxial layer, wherein the first electrode forms a Schottky contact with the channel layer, and wherein a resistance of the part of the doped epitaxial layer in contact with the first electrode is greater than a resistance of the channel layer;
   wherein the doped epitaxial layer comprises a P-type or N-type doped region, and wherein the P-type or N-type doped region is in contact with at least a part of the first electrode located within the doped epitaxial layer;
   wherein the first electrode is an anode, and wherein the anode comprises a first corner and a second corner located within the doped epitaxial layer, and an anode bottom surface connecting the first corner and the second corner; and
   wherein the P-type or N-type doped region envelopes at least a part of the first corner and/or the second corner of the anode located in the doped epitaxial layer.

2. The semiconductor device according to claim 1, wherein the first electrode comprises a first electrode bottom surface located within the doped epitaxial layer; and
   a distance L2 between the first electrode bottom surface and a surface on one side of the channel layer close to the substrate satisfies L2≤200 nm.

3. The semiconductor device according to claim 1, wherein along a direction perpendicular to the substrate, a thickness h1 of the doped epitaxial layer satisfies 10 nm≤h1≤50 μm.

4. The semiconductor device according to claim 1, wherein the P-type or N-type doped region envelopes the first corner, the second corner, and the anode bottom surface.

5. The semiconductor device according to claim 1, wherein a two-dimensional electron gas is formed in the channel layer close to the interface of the channel layer and the potential barrier layer, and wherein along a direction perpendicular to the substrate, a distance L1 between the P-type or N-type doped region and the two-dimensional electron gas satisfies L1≥50 nm.

6. The semiconductor device according to claim 1, wherein the second electrode is a cathode and the anode extends in a first direction, and wherein the first direction is parallel to the substrate and perpendicular to the direction of the cathode pointing towards the anode; and
   the P-type or N-type doped region extends along the first direction, or, along the first direction, the P-type or N-type doped region comprises a plurality of spaced apart P-type or N-type sub-doped regions.

7. The semiconductor device according to claim 1, wherein the first electrode is an anode, and wherein the semiconductor device further comprises an anode metal field plate;
   the anode comprises a first anode portion and a second anode portion, the first anode portion penetrates the potential barrier layer, the channel layer and part of the doped epitaxial layer, and the first anode portion forms a Schottky contact with the channel layer, and the second anode portion is located on a surface of the potential barrier layer on the side away from the channel layer; and
   the second anode portion is used as the anode metal field plate.

8. The semiconductor device according to claim 1, wherein the semiconductor device further comprises a buffer layer located between the substrate and the channel layer.

9. The semiconductor device according to claim 8, wherein part of the side of the buffer layer close to the channel layer is a high resistance layer, and wherein the doped epitaxial layer is the high resistance layer.

10. A method of manufacturing a semiconductor device, the method comprising:
    providing a substrate;
    forming a doped epitaxial layer on one side of the substrate;
    forming a channel layer on one side of the doped epitaxial layer away from the substrate;
    forming a potential barrier layer on one side of the channel layer away from the doped epitaxial layer;
    forming a first electrode and a second electrode on one side of the potential barrier layer away from the channel layer, wherein the first electrode penetrates the potential barrier layer, the channel layer, and part of the doped epitaxial layer, wherein the first electrode forms a Schottky contact with the channel layer, and wherein a resistance of the part of the doped epitaxial layer in contact with the first electrode is greater than a resistance of the channel layer;
    wherein after the step of forming a doped epitaxial layer on one side of the substrate, the method further comprises:
      forming a P-type or N-type doped region in the doped epitaxial layer, wherein the P-type or N-type doped region is in contact with at least a part of the first electrode in the doped epitaxial layer;

wherein the first electrode is an anode, and wherein the anode comprises a first corner, a second corner located within the doped epitaxial layer, and an anode bottom surface connecting the first corner and the second corner; and wherein the P-type or N-type doped region envelopes at least a part of the first corner and/or the second corner.

* * * * *